United States Patent [19]

Runas et al.

[11] Patent Number: 5,530,392

[45] Date of Patent: Jun. 25, 1996

[54] BUS DRIVER/RECEIVER CIRCUITRY AND SYSTEMS AND METHODS USING THE SAME

[75] Inventors: Michael E. Runas, McKinney; Kirit B. Patel, Dallas, both of Tex.

[73] Assignee: Cirrus Logic, Inc., Fremont, Calif.

[21] Appl. No.: 420,138

[22] Filed: Apr. 11, 1995

[51] Int. Cl.$^6$ ................................................. H03K 5/153
[52] U.S. Cl. .......................... 327/333; 327/111; 327/78
[58] Field of Search ................................. 327/57, 78, 85, 327/111, 333

[56] References Cited

U.S. PATENT DOCUMENTS

| | | | |
|---|---|---|---|
| 3,906,254 | 9/1975 | Lane et al. | 307/205 |
| 4,039,862 | 8/1977 | Dingwall et al. | 307/247 |
| 4,450,371 | 5/1984 | Bismarck | 307/475 |
| 4,486,670 | 12/1984 | Chan et al. | 307/264 |
| 4,629,911 | 12/1986 | Bebernes et al. | 327/85 |
| 4,703,199 | 10/1987 | Ely | 327/333 |
| 4,730,131 | 3/1988 | Sauer | 307/443 |
| 4,914,318 | 4/1990 | Allen | 307/272.2 |
| 4,978,870 | 12/1990 | Chen et al. | 307/475 |
| 4,991,136 | 2/1991 | Mihara | 365/49 |
| 5,047,980 | 9/1991 | Shookhtim et al. | 365/117 |
| 5,251,178 | 10/1993 | Childers | 365/227 |
| 5,274,275 | 12/1993 | Colles | 327/78 |
| 5,382,838 | 1/1995 | Sasaki et al. | 327/333 |

FOREIGN PATENT DOCUMENTS

| | | | |
|---|---|---|---|
| 000504470 | 9/1992 | European Pat. Off. | 327/333 |
| 403062720 | 3/1991 | Japan | 327/333 |
| 404266216 | 9/1992 | Japan | 327/333 |

*Primary Examiner*—Margaret Rose Wambach
*Attorney, Agent, or Firm*—Winstead, Sechrest & Minick

[57] ABSTRACT

Data transmission circuitry 200 is disclosed which includes a transmission line 201, driver circuitry 202, and receiver circuitry 206. Driver circuitry 202 is coupled to transmission line 201 and sets transmission line 201 to a low transmission voltage level during transmission of information of a first logic state and sets transmission line 201 to a higher transmission voltage during transmission of information of a second logic state. Receiver circuitry 206 compares the voltage on transmission line 201 with a static reference voltage which is a predetermined fraction of the higher transmission voltage and in response latches an output to a corresponding logic state. Receiver circuitry 206 latches the output in an output high logic state to an output voltage which is a multiple of the higher transmission voltage.

21 Claims, 1 Drawing Sheet

BUS DRIVER/RECEIVER CIRCUITRY AND SYSTEMS AND METHODS USING THE SAME

CROSS-REFERENCE

The following copending and coassigned U.S. patent applications contain related material and are incorporated by reference:

U.S. patent application Ser. No. 08/434,656, entitled "High Performance Bus Driving/Receiving Circuits, Systems and Methods", filed concurrently herewith.

TECHNICAL FIELD OF THE INVENTION

The present invention relates in general to electronic circuitry and in particular to bus driver/receiver circuitry and systems and methods using the same.

BACKGROUND OF THE INVENTION

In designing high performance integrated circuits, the high speed transfer of addresses and data between circuit blocks is a critical consideration. This is especially true in applications where a memory and a high performance state machine are being integrated into a single chip. One such instance is when a display controller and a frame buffer are being integrated to produce single-chip high performance display control device. In this case, substantial amounts of data, and the corresponding addresses, must be transferred between the graphics controller and the frame buffer at rates high enough to support display refresh and update, and other processing operations such as filtering. As display systems with increased resolution and bit depths are developed, the rate at which data must be transferred between the controller and the frame buffer consequently increases. While some of the necessary bandwidth can be achieved by using wide buses, improvement in the speed at which data is transferred over the individual bus lines is still required.

The lines of a typical on-chip bus are long, thin conductors which extend relatively substantial lengths across the face of the substrate, the substrate spacing each conductor from the chip ground plane. As a result of this configuration, each line presents a significant capacitance which must be charged or discharged by a driver or similar circuit during data transmission. The result is substantial power consumption, in particular when the driver is driving one or more bus lines towards the positive voltage supply rail to transmit logic high data. This power consumption is primarily due to bus line capacitance, which increases directly with the data transmission rate across the bus conductors. In generals $P=CV^2f$, where P is the power loss through each conductors V is the voltage applied, C is the capacitance of the conductor and f is the frequency at which the conductor is charged/discharged. It should also be noted that some additional power consumption results from the resistance of each bus line.

It is possible to reduce power consumption by reducing the capacitance of the bus lines themselves. This option however requires that the fabrication process for the chip be modified. Such a change in process to reduce line capacitance is expensive and may adversely effect the fabrication of other circuitry on the chip. Another option is to reduce the frequency at which data is transferred across the bus. Assuming that the width of the bus is not increased, this option simply trades off system performance for power reduction, an option which usually is not viable in the implementation of high performance circuits devices.

Thus, the need has arisen for improved circuits, systems and methods for the high speed transfer of data and/or addresses across the lines of a bus. Such circuits, systems and methods should advantageously minimize power consumption and the problems attendant therewith. In particular, such circuits, systems and methods should be applicable to high performance integrated circuit applications, such as when a display controller and frame buffer are integrated on a single chip. Finally, such circuits, systems and methods should neither require expensive and complicated changes to the chip fabrication process nor require a reduction in system performance for implementation.

SUMMARY OF THE INVENTION

The principles of the present invention provide for the high speed transmission of information across a conductive transmission line using minimal power. In general, data is received at the input of a line driver circuit with a full voltage swings typically between ground and the system supply voltage. In response, the driver circuit drives data across the transmission line with a transmission voltage swing, typically between ground and a fraction of the system supply voltage. The driver circuit may be an inverting driver, a non-inverting drivers or may operate on the incoming data with a selected logic function. At least one receiver circuit is coupled to the transmission line for receiving data at the transmission voltage swing. The receiver circuit compares the received voltage on the transmission line with a reference voltage which is approximately one-half of the higher transmission voltage. When the voltage on the transmission line is less than the reference voltage, the output of the receiver is latched low. When the voltage on the transmission line is higher than the reference of voltage, the output of the receiver latches to a logic high voltage which is approximately equal to the system supply voltage.

According to a first embodiment of the principles of the present invention, transmission circuitry is provided which includes a transmission lines driver circuitry coupled to the transmission line, and receiver circuitry also coupled to the transmission line. The driver circuitry sets the transmission line to a low transmission voltage level during transmission of information of a first logic state and sets the transmission line to a higher transmission voltage during transmission of information of a second logic state. The receiver circuitry compares the voltage on the transmission line with a static reference voltage of a fraction of the higher transmission voltage and in response latches an output to a corresponding logic state. In an output high logic state, the receiver circuitry latches the output to an output voltage which is a multiple of the higher transmission voltage.

According to another embodiment of the principles of the present invention, line driver/receiver circuitry is provided for transferring information across a conductive line. A driver is included for receiving input information having an input voltage swing between a low voltage and a first supply voltage and driving the conductive line with information having a transmission voltage swing between the low voltage and a second supply voltage, the second supply voltage being less than the first supply voltage. A receiver is provided for receiving the information of the transmission voltage swing from the line and outputting information of the input voltage swing. The receiver includes a first transistor of a first type having a first source/drain coupled to a supply voltage rail at the first supply voltage. A second transistor of a second type has a first source/drain coupled to a second/source drain of the first transistor and a second source/drain coupled to ground. A third transistor is included of the first type which has a first source/drain coupled to the supply voltage rail. A fourth transistor of the second type includes a first source/drain coupled to a second source/drain of the third transistor and a second source/drain coupled to ground, a node at the coupling of the second source/drain of the third transistor and the first source/drain of the fourth transistor forming an output of the receiver. A fifth transistor is included which has a gate coupled to the conductive line, a first source/drain coupled to gates of the first and second transistors and the second source/drain of the third transistor, and a second source/drain coupled to ground. Finally, a sixth transistor is provided having a gate coupled to a reference voltage of a fraction of the second supply voltage, a first source/drain coupled to gates of the third and fourth transistors and the second source/drain of the first transistor, and a second source/drain coupled to ground.

The principles of the present invention are also embodied in a data processing system including a transmission lined a first block of circuitry, and a second block of circuitry. The first block of circuitry includes a driver for driving the transmission line with a first voltage swing between a low voltage and a predetermined fraction of a system voltage supply. The second block of circuitry includes a receiver for receiving data at the first voltage swing from the line and outputting data with a second voltage swing between the low voltage and approximately the system supply voltage. The receiver includes a first transistor of a first type having a first source/drain coupled to a supply voltage rail at the system supply voltage. A second transistor of a second type has a first source/drain coupled to a second source/drain of the first transistor and a second source/drain coupled to ground. A third transistor of the first type is included in the receiver which has a first source/drain coupled to the supply voltage rail. A fourth transistor of the second type has a first source/drain coupled to a second source/drain of the third transistor and a second source/drain coupled to ground, a node at the coupling of the second source/drain of the third transistor and the first source/drain of the fourth transistor forming an output of the receiver. The receiver includes a fifth transistor having a gate coupled to the lined a first source/drain coupled to gates of the first and second transistors and the second source/drain of the third transistor, and a second source/drain coupled to ground. Finally, the receiver includes a sixth transistor having a gate coupled to a reference voltage of a fraction of the predetermined fraction of the system supply voltage, a first source/drain coupled to gates of the third and fourth transistors and the second source/drain of the first transistor, and a second source/drain coupled to ground.

The present invention is also embodied in methods of transmitting data between first and second circuits coupled by a transmission line, the first and second circuits operating from a predetermined supply voltage. In these embodiments, the transmission line is set to a low voltage level during transmission of information of a first logic state. The transmission line is set to a higher voltage during transmission of information of a second logic state, the higher voltage being a predetermined fraction of the supply voltage. The voltage on the transmission line is compared with a static reference voltage of a fraction of the predetermined fraction of the supply voltage. Finally, an output of a receiver at the second circuitry is latched to a corresponding logic state, the step of latching including the sub-step of latching the output high logic state to an output voltage which is substantially equivalent to the supply voltage.

The principles of the present invention provide for the implementation of high performance bus driver/receiver circuits and systems and methods using the same. In particular, these principles allow for the minimization of power consumption, and the problems attended therewith, when data and/or addresses are being transmitted across a conductive line. Specifically, power consumption due to charging and discharging of the bus transmission lines is reduced by reducing the transmission voltage swing. The circuits, systems and methods embodying the principles of the present invention are particularly applicable to high-performance integrated circuit applications, such as when a display controller and a frame buffer are integrated on a single chip.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and the specific embodiment disclosed may be readily utilized as a basis for modifying or designing other structures for carrying out the .same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF THE INVENTION

Figure 1:
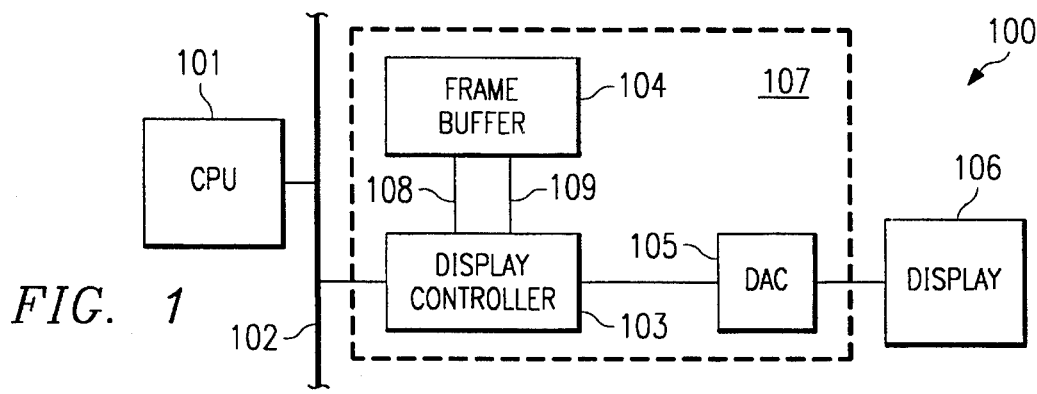
FIG. 1 is a functional block diagram of a display control system.
Figure 2:
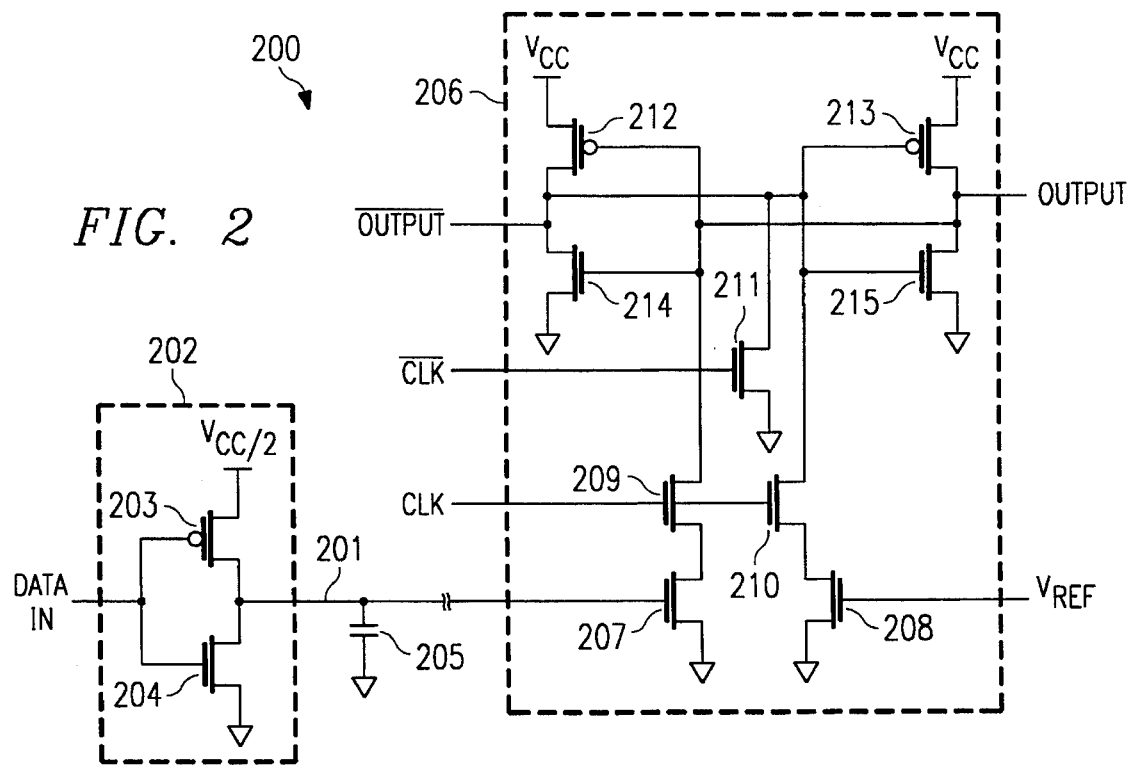
FIG. 2 is an electrical schematic diagram of bus line driver/receiver circuitry embodying the principles of the present inventions the circuitry of FIG. 2 suitable in one application for transferring data across address and data buses coupling the display controller and frame buffer of the system illustrated in FIG. 1.
Figure 3:
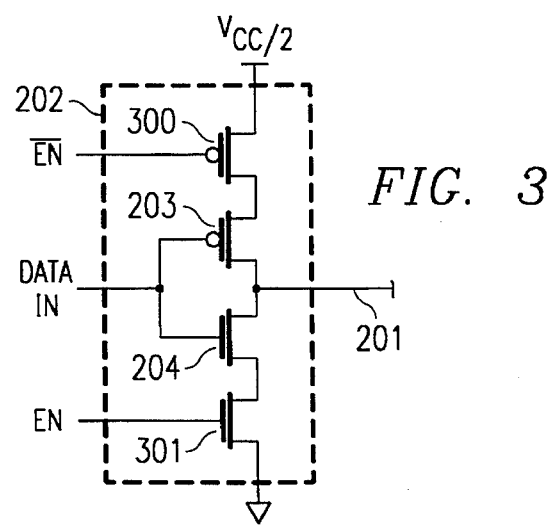
FIG. 3 is an electrical schematic diagram of an alternate driver circuit for use in the line driver/receiver circuitry of FIG. 2, the circuitry of FIG. 3 being particularly useful for driving bidirectional buses.

The principles of the present invention and their advantages are best understood by referring to the illustrated embodiment depicted in FIGS. 1–3 of the drawings, in which like numbers designate like parts. For purposes of illustration, the principles of the present invention will be described as may be implemented in a display system frame buffer although these principles may be applied to a number of different data processing circuits and systems as will become apparent from the discussion below.

FIG. 1 is a high level functional block diagram of the portion of a processing system 100 controlling the display of graphics and/or video data. System 100 includes a central processing unit 101, a system bus 102, a display controller 103, a frame buffer 104, a digital to analog converter (DAC)

105 and a display device 106. Display controller 103, frame buffer 104 and DAC 105 may fabricated together on a single integrated circuit chip 107 or on separate chips. Display controller 103 and frame buffer 104 are coupled by an address bus 108 and an associated data bus constructed in accordance with the principles of the present invention.

CPU 101 controls the overall operation of system ("master") 100, determines the content of graphics data to be displayed on display unit 106 under user commands, and performs various data processing functions. CPU 101 may be for example a general purpose microprocessor used in commercial personal computers. CPU 101 communicates with the remainder of system 100 via system bus 102, which may be for example a local bus, an ISA bus or a PCI bus. DAC 105 receives digital data from controller 103 and outputs in response the analog data required to drive display 106. Depending on the specific implementation of system 100, DAC 105 may also include a color palettes YUV to RGB format conversion circuitry, and/or x- and y-zooming circuitry, to name a few options.

Display 106 may be for example a CRT unit or liquid crystal displays electroluminescent display (ELD), plasma display (PLD), or other type of display device displays images on a display screen as a plurality of pixels. It should also be noted that in alternate embodiments, "display" 106 may be another type of output device such as a laser printer or similar document view/print appliances.

FIG. 2 is an electrical schematic diagram of bus driver/receiver circuitry 200 for transmitting data across a transmission line, such as a given line 201 of address bus 108 or data bus 109 (FIG. 1). In FIG. 2, the selected line 201 is assumed to be unidirectional for discussion purposes. An alternate driver for transferring data across a bidirectional bus, such as data bus 109, is discussed below in conjunction with FIG. 3. It should be noted that in system 100, driver/receiver circuitry 200 could also be applied to the transmission of data and/or addresses between system bus 102 and display controller 103, between display controller 103 and DAC 105, or between DAC 105 and display 106, to name only a few examples.

Transmission of data onto bus line (conductor) 201 is accomplished in the illustrated embodiment through an inverting bus driver 202 including a p-channel transistor 203 coupled in series with an n-channel transistor 204. Output high voltage drive is provided through p-channel transistor 203 in the preferred embodiment from a supply voltage rail at a voltage of $V_{CC}/2$, where $V_{CC}$ in the illustrated embodiment is the supply voltage for integrated circuit 107. For a CMOS embodiment, $V_{CC}$ may be approximately +5 V or +3.3 V (and $V_{CC}/2$ consequently either 2.5 V or 1.6 V). In alternate embodiments, bus driver 202 may be a noninverting driver operating from a $V_{CC}/2$ voltage rail or may implement a selected logic function (e.g., AND, OR, NAND, NOR, etc.).

In the illustrated embodiment, transistors 203 and 204 drive (charge/discharge) a parasitic capacitance $C_{para}$ on bus line 201, which is represented in FIG. 2 by a capacitor 205. Capacitance $C_{para}$ is assumed to have an approximate value of 2 pf for illustrative purposes. The value of $C_{para}$ will vary from physical embodiment to physical embodiment and will depend on such factors as the length and width of the conductor and the spacing from the ground plane.

Reception of data from line 201 is implemented using receiver circuitry 206. Data line 201 is coupled to the gate of n-channel transistors 207. The gate of a second n-channel transistor 208 is coupled to a reference voltage source $V_{ref}$.

Clock signal CLK is coupled to the gates of n-channel transistors 209 and 210. The complement of clock CLK, $\overline{CLK}$, is coupled to the gate of n-channel transistor 211.

N-channel transistors 207–211 control a cross-coupled latching circuit formed by p-channel transistors 212 and 213 and n-channel transistors 214 and 215. P-channel transistors 212 and 213 selectively couple receiver circuitry 206 to a voltage rail at the full system (chip) supply voltage $V_{CC}$. The embodiment of circuitry 206 shown in FIG. 2 includes true and complementary outputs OUTPUT and $\overline{OUTPUT}$, the polarity being referenced to the input of inverting driver 202.

Assume for discussion purposes that the driver/receiver circuitry 200 is operating at a supply voltage $V_{CC}$ of 3.3 volt system and consequently $V_{CC}/2$ is approximately 1.6 volts. The reference voltage $V_{ref}$ is then chosen to be approximately 0.75 volts (i.e. approximately one-half of $V_{CC}/2$ or $V_{CC}/4$.

Prior to receiving data, clock CLK is low and its complement $\overline{CLK}$ is high. In this state OUTPUT is held high and $\overline{OUTPUT}$ is held low. When sensing of data (logic high or logic low) is taking place, clock CLK goes high and its complement $\overline{CLK}$ goes low. Consequently, transistors 209 and 210 are turned on and transistor 211 is turned off. In this state, operation of receiver circuitry 206 is controlled by the difference in voltage between the gates of transistors 207 and 208.

When DATA IN is low (logic 0 data is being transferred) inverting driver circuitry 202 pulls line 202 high, the voltage at the gate of transistor 207 is greater than the reference voltage $V_{ref}$ presented at the gate of transistor 208. Transistor 207 therefore pulls down the voltage at the gates of transistors 212 and 214 and node $\overline{OUTPUT}$ more than transistor 208 pulls down the voltage at the gates of transistors 213 and 215 and node OUTPUT, In this state, p-channel transistor 212 and n-channel transistor 215 are on and p-channel transistor 213 and n-channel transistor 214 are off. The result is that the true output node OUTPUT is latched low and the complementary output node, $\overline{OUTPUT}$ is latched high.

When logic high data is being transferred (i.e., DATA IN is high), driver 202 pulls down line 201. In this case, the voltage at the gate of transistor 207 is less than the reference voltage $V_{ref}$ appearing at the gate of transistor 208. Transistor 208 therefore pulls down the gates of transistors 213 and 215 more than transistor 207 pulls down the gates of transistors 212 and 214. In this case, the voltage at node OUTPUT is higher than the voltage at node $\overline{OUTPUT}$. P-channel transistor 213 and n-channel transistor 214 are turned on while p-channel transistor 212 and n-channel transistor 215 are turned off. Thus, true output node OUTPUT is latched high and complementary node $\overline{OUTPUT}$ is latched low.

In sum, in accordance with the principles of the present invention, data is transmitted over a given conductive line at voltage levels substantially less than the voltage used in conventional bus/line driver schemes. In the illustrated embodiment for example, line 201 transmits data at either zero volts or $V_{CC}/2$. At the receiving end of the bus, the data is returned to the conventional logic voltage levels (i.e., zero volts and $V_{CC}$ for further processing. In this fashion, substantial power reduction can be achieved while still maintaining high data transfer rates.

$\overline{EN}$

FIG. 3 depicts an alternate embodiment of bus (line) driver circuitry 202 particularly suitable for driving a given line 201 of a bidirectional bus, such as data bus 109 in the illustrated embodiment. In the configuration of FIG. 3, driver circuitry includes transistors 300 and 301 which allow the output of circuitry 202 to be switched into a high impedance state in response to a control signal EN and its complement $\overline{EN}$. In the case of a bidirectional bus line, two drivers circuits 202 and two receiver circuits 206 are employed, one driver 202 and one receiver 206 at each end. Control signal EN is set high (and consequently $\overline{EN}$ low) for the transmitting driver 202 and is set low for the driver 202 on the receiving end of the line (i.e., such that the output is in a high impedance state). Clock CLK is set high and $\overline{CLK}$ set low for the receiver circuitry 206 on the receiving end of the line. Clock CLK is set low and $\overline{CLK}$ is set high for the receiver circuitry 206 on the transmitting end of the line.

Although the present invention and its advantages have been described in detail, it should be understood that various changes, substitutions and alterations can be made herein without departing from the spirit and scope of the invention as defined by the appended claims.

What is claimed is:

1. Data transmission circuitry comprising:

a transmission line;

driver circuitry coupled to said transmission line, said driver circuitry setting said transmission line to a low transmission voltage level during transmission of information of a first logic state and setting said transmission line to a higher transmission voltage during transmission of information of a second logic state; and receiver circuitry operable to compare voltage on said transmission line with a static reference voltage substantially equal to a predetermined fraction of said higher transmission voltage and, in response to said comparison, latch an output to a corresponding logic state, said receiver circuitry latching said output in an output high logic state to an output voltage which is a multiple of said higher transmission voltage.

2. The data transmission circuitry of claim 1 wherein said output voltage is approximately twice said higher transmission voltage.

3. The data transmission circuitry of claim 1 wherein said receiver circuitry comprises:

latching circuitry including:

a first transistor of a first type having a first source/drain coupled to a supply voltage rail at said multiple of said higher transmission voltage;

a second transistor of a second type having a first source/drain coupled to a second source/drain of said first transistor and a second source/drain coupled to ground;

a third transistor of said first type having a first source/drain coupled to said supply voltage rail; and a fourth transistor of said second type having a first source/drain coupled to a second source/drain of said third transistor and a second source/drain coupled to ground;

a first control transistor having a gate coupled to said transmission liner a first source/drain coupled to gates of said first and second transistors of said latching circuitry and said second source/drain of said third transistor of said latching circuitry, and a second source/drain coupled to ground;

a second control transistor having a gate coupled to said reference voltage, a first source/drain coupled to gates of said third and fourth transistors of said latching circuitry and said second source/drain of said first transistor of said latching circuitry, and a second source/drain coupled to ground; and wherein a node at the coupling of said second source/drain of said third transistor and said first source/drain of said fourth transistor forms said output.

4. The data transmission circuitry of claim 3 wherein said first type comprises p-type and said second type comprises n-type.

5. The data transmission circuitry of claim 1 wherein said driver circuitry comprises an inverting driver.

6. The data transmission circuitry of claim 1 wherein said driver circuitry comprises:

a first transistor of said first type having a current path for coupling said transmission line with a voltage supply rail at said higher transmission voltage;

a second transistor of said second type having a current path for coupling said transmission line with a low voltage; and wherein respective gates of said first and second transistors of said driver circuitry are coupled together to form a driver input and a node at a coupling of said current paths of said first and second transistors of said driver circuitry forming a driver output for coupling to said transmission line.

7. Line driver/receiver circuitry for transferring information across a conductive line comprising:

a driver for receiving input information having a first voltage swing between a low voltage and a first supply voltage and driving said conductive line with transmission information having a second voltage swing between said low voltage and a second supply voltage, said second supply voltage being less than said first supply voltage; and a receiver for receiving said transmission information having said second voltage swing from said conductive line and outputting output information having a third voltage swing substantially equal to said first voltage swing, said receiver comprising:

a first transistor of a first type having a first source/drain coupled to a supply voltage rail at said first supply voltage;

a second transistor of a second type having a first source/drain coupled to a second source/drain of said first transistor and a second source/drain coupled to ground;

a third transistor of said first type having a first source/drain coupled to said supply voltage rail;

a fourth transistor of said second type having a first source/drain coupled to a second source/drain of said third transistor and a second source/drain coupled to ground, wherein a node at the coupling of said second source/drain of said third transistor and said first source/drain of said fourth transistor forms an output of said receiver;

a fifth transistor having a gate coupled to said line, a first source/drain coupled to gates of said first and second transistors and said second source/drain of said third transistor, and a second source/drain coupled to ground; and a sixth transistor having a gate coupled to a reference voltage substantially equal to a predetermined fraction of the second supply voltage, a first source/drain coupled to gates of said third and fourth transistors and said second source/drain of said first transistor, and a second source/drain coupled to ground.

8. The circuitry of claim 7 wherein said information comprises data.

9. The circuitry of claim 7 wherein said information comprises addresses.

10. The circuitry of claim 7 wherein said second supply voltage is a fraction of said first supply voltage.

11. The circuitry of claim 7 wherein said second supply voltage is approximately one half said first supply voltage.

12. The circuitry of claim 7 and further comprising:
a seventh transistor of said first type having a current path coupling said first source/drain of said fifth transistor with said gates of said first and second transistors and said second source/drain of said third transistor, and a gate coupled to receive a clock signal; and
a eighth transistor of said first type having a current path coupling said first source/drain of said sixth transistor with said gates of said third and fourth transistors and said second source/drain of first transistor, and a gate coupled to receive said clock signal.

13. The circuitry of claim 7 and further comprising a transistor of said first type having a first source/drain coupled to gates of said third and fourth transistors and said second source/drain of said first transistor, a second source/drain coupled to ground, and a gate coupled to receive a complementary signal clock signal.

14. A data processing system comprising:
a transmission line;
a first block of circuitry including a driver for driving said line with a first voltage swing between a low voltage and a predetermined fraction of a system supply voltage; and
a second block of circuitry including a receiver for receiving data at said first voltage swing from said line and outputting data with a second voltage swing between said low voltage and said system supply voltage, said receiver comprising:
a first transistor of a first type having a first source/drain coupled to a supply voltage rail at said system supply voltage;
a second transistor of a second type having a first source/drain coupled to a second source/drain of said first transistor and a second source/drain coupled to ground;
a third transistor of said first type having a first source/drain coupled to said supply voltage rail;
a fourth transistor of said second type having a first source/drain coupled to a second source/drain of said third transistor and a second source/drain coupled to ground, wherein a node at the coupling of said second source/drain of said third transistor and said first source/drain of said fourth transistor forms an output of said receiver;
a fifth transistor having a gate coupled to said line, a first source/drain coupled to gates of said first and second transistors and said second source/drain of said third transistor, and a second source/drain coupled to ground; and
a sixth transistor having a gate coupled to a reference voltage of a fraction of said predetermined fraction of said system supply voltage, a first source/drain coupled to gates of said third and fourth transistors and said second source/drain of said first transistor, and a second source/drain coupled to ground.

15. The system of claim 14 wherein said first block of circuitry includes a state machine.

16. The system of claim 14 wherein said second block of circuitry includes a memory.

17. The system of claim 14 wherein said transmission line comprises one of a plurality of transmission lines forming a bus.

18. The system of claim 14 wherein said predetermined fraction is substantially one-half.

19. The system of claim 14 wherein said transmission line and said first and second blocks of circuitry are disposed on a single chip.

20. A method of transmitting data between first and second circuits coupled by a transmission line, the first and second circuits operating from a predetermined supply voltage, comprising the steps of:
setting the transmission line at the first circuit to a low voltage during transmission of information of a first logic state;
setting the transmission line at the first circuit to a higher voltage during transmission of information of a second logic state, the higher voltage being a predetermined fraction of the supply voltage;
comparing the voltage on the transmission line with a static reference voltage substantially equal to a predetermined fraction of the predetermined fraction of the supply voltage; and
latching an output of a receiver at the second circuit to a corresponding logic state, said step of latching including the substep of latching the output in an output high logic state to an output voltage which is substantially equivalent to the supply voltage.

21. The method of claim 20 wherein the predetermined fraction of the supply voltage is approximately one-half.

* * * * *